United States Patent [19]
Ota

[11] Patent Number: 5,739,566
[45] Date of Patent: Apr. 14, 1998

[54] NON-VOLATILE SEMICONDUCTOR MEMORY CELL ARRAY

[75] Inventor: Noriyuki Ota, Tokyo, Japan

[73] Assignee: NEC Corporation, Tokyo, Japan

[21] Appl. No.: 564,445

[22] Filed: Nov. 29, 1995

[30] Foreign Application Priority Data

Nov. 29, 1994 [JP] Japan ................... 6-294865

[51] Int. Cl.$^6$ ............ H01L 29/788; H01L 29/76; H01L 29/94; H01L 31/119
[52] U.S. Cl. ............ 257/315; 257/316; 257/298
[58] Field of Search ............ 257/315, 316, 257/758, 298, 324; 437/52

[56] References Cited

U.S. PATENT DOCUMENTS

| | | | |
|---|---|---|---|
| 4,811,078 | 3/1989 | Tigelaar et al. | 257/315 |
| 4,868,619 | 9/1989 | Mukherjee et al. | 257/316 |
| 5,051,794 | 9/1991 | Mori | 257/316 |
| 5,315,142 | 5/1994 | Acovic et al. | 257/316 |
| 5,331,188 | 7/1994 | Acovic et al. | 257/298 |
| 5,341,026 | 8/1994 | Harada et al. | 257/758 |

FOREIGN PATENT DOCUMENTS 3-285359  12/1991  Japan .

*Primary Examiner*—Stuart S. Levy
*Assistant Examiner*—Adriana Giordana
*Attorney, Agent, or Firm*—Young & Thompson

[57] ABSTRACT

The present invention provides a floating gate electrode structure in a non-volatile semiconductor memory device. The floating gate electrode comprises a base portion, a contact portion and a head portion. The base portion horizontally extends on a first gate insulation film so as to be positioned over a channel region of a semiconductor substrate. The contact portion upwardly extends from the base portion. The contact portion is provided within a vertical contact hole formed in an inter-layer insulator covering the base portion. The inter-layer insulator encloses bit lines. The bit lines are positioned above the base portion and electrically separated by the inter-layer insulator from both the contact portion and the base portion. The head portion horizontally extends on the inter-layer insulator to be in contact with the contact portion so that the head portion is electrically coupled to the base portion via the contact portion. The head portion is in contact with and underlies a second gate insulation film. The gate insulation film is in contact with and underlies a control electrode. The head portion is electrically separated by the inter-layer insulator from the bit lines. The area of a first interface between the base portion and the first gate insulation film is smaller than the area of a second interlace between the head portion and the second gate insulation film.

13 Claims, 6 Drawing Sheets

NON-VOLATILE SEMICONDUCTOR MEMORY CELL ARRAY

BACKGROUND OF THE INVENTION

The present invention relates to a semiconductor device, and more particularly to a non-volatile semiconductor memory array structure, There have been developed many semiconductor memory devices in which a flash electrically erasable and programmable read only memory device is now receiving a great deal of attention due to its simple structure caused by utilizing its floating gate transistors. Each floating gate transistor constitutes a single memory cell of the memory device. In other word, each memory cell comprises a single floating gate transistor. This facilitates a high density integration of the memory cell arrays, The floating gate transistor requires a high control voltage to be applied on a control gate. Thus, the flash electrically erasable and programmable read only memory device needs a higher gate voltage than gate voltages of dynamic random access memory devices and static random access memory devices.

The floating gate transistor has a double gate electrode structure wherein a first gate electrode is named as a floating gate electrode and a second gate electrode is named as a control gate electrode. The floating gate electrode is provided on a first gate oxide film provided on a channel region. The control gate electrode is provided on a second gate oxide film provided on the floating gate electrode. Control gate signals are applied to the control gate electrode, while the floating gate remains electrically floated and an electric field is generated across the first gate oxide film. The electric field can cause electrons to be injected rate or discharged from the floating gate electrode via the first gate oxide film. Information is written by injecting electrons into the floating gate electrode and erased by discharging the electrons from the floating gate electrode. The electron injection or discharge is obtained by applying a high electric field across the fast gate oxide film. To apply the high electric field across the first gate oxide film, it is required to apply a high voltage to the control gate electrode. For which reason, the floating gate transistor requires a high control voltage. This results in a high power consumption.

In order to reduce a power consumption of the memory device, it is effective to utilize a Fowler-Nordheim tunneling of electron across the first gate oxide film for the electron injection or discharge. It is also effective to provide an internal boosting up circuit for raising an internal voltage.

A typical conventional structure of the flash memory cell arrays including memory cells comprising floating gate transistors will be described in detail with reference to FIGS. 1, 2A and 2B.

As illustrated in FIG. 1, the flash memory cell arrays are formed on a semiconductor substrate 101. Field oxide films are selectively formed on a surface of the semiconductor substrate 101 to define active regions and passive regions of the substrate 101. On the active region, gate regions, source/drain regions are formed. Word lines 103 are formed in parallel to each other. Bit lines 104 are formed above the word lines 103. The bit lines are parallel to each other in a perpendicular direction to a direction of the word lines 103. The bit lines 104 transmit write/read signals.

FIG. 2A is a cross sectional elevation view along an A–B line along the word lines 103 in FIG. 1. The field oxide films 102 are selectively formed on the surface of the semiconductor substrate 101. On the active regions bounded by the field oxide films 102, first gate oxide films 106 are provided. Floating gate electrodes 107 are selectively formed on the first gate oxide films. A second gate oxide film 108 comprising a silicon oxide film and a silicon nitride film is entirely formed to cover the floating gate electrodes 107 and the field oxide films 102. Word lines 103 made of impurity-doped polysilicon films are formed on the second gate oxide films 108. A first inter-layer insulator 109 is entirely formed to cover the double gate structures and the first gate oxide films 106. The bit lines 104 are selectively formed on the top of the first inter-layer insulator 109. A second inter-layer insulator 110 is entirely formed to cover the bit lines 104 and the first inter-layer insulator 109.

FIG. 2B is a cross sectional elevation view along a C–D line along the bit lines 104 in FIG. 1. Source and drain diffusion regions 105 and 111 are selectively provided in an upper region of the substrate 101 to define channel regions. The first gate oxide film is formed on the substrate 101. The floating gate electrode 107 are selectively provided over the channel region via the first gate oxide film 106. The first gate oxide firms 108 are selectively formed on the floating gate electrodes 107. The control electrodes constituting the word lines 103 are formed on the second gate oxide film 108. The floating gate electrodes 107 have a length, in the stone direction as the channel length direction, equal to the width of the word lines 103. This structure facilitates the required high density integration of the memory cells comprising the floating gate transistors. The first inter-layer insulator 109 is entirely formed to embed the double gate structures. The first inter-layer insulator 109 has contact holes over the drain regions 111. The bit lines 104 are formed on the first inter-layer insulator 109 and also within the contact holes to be made into contact with the drain regions 111. The second inter-layer insulator 110 is entirely formed to embed the bit lines 104.

As described above, the word lines 107 are formed below the bit lines 104. In order to realize the high density integration office memory cells, the floating gate length in the channel length direction is designed to the same as the width of the word lines. In forming the double gate structure, the word lines 103 and the floating gate electrodes 107 are patterned by a dry etching using of a common mask pattern. The first gate oxide film 106 under the floating gate electrode 107 has almost the same area as the area of the second gate oxide film. For which reason, the first gate oxide film under the gate structure has almost the same capacity of the second gate oxide film.

Under the above circumstances, the necessary voltage levels for the erasure and write operations are respectively approximately 12 V and approximately 5 V, which are higher than the necessary voltages for the dynamic random access memory devices and the static random access memory devices. In order to reduce the power consumption, it essential to reduce the control voltage level as much as possible. It is also essential for the high density integration of the memory cells to realize a possible scaling down of the memory cell structure.

In order to reduce the necessary control voltage level, it is effective to increase a ratio of the second capacity of the second gate oxide film to the first capacity of the first gate oxide film so as to cruise an increased voltage across the first gate oxide film while a decreased voltage across the second gate oxide film. This means that an increased electric field is applied across the first gate oxide film while a decreased electric field is applied across the second gate oxide film. This can cause the required strong electric field across the first gate oxide film by applying a not so high level control voltage to the control gate electrode. For the above purpose, it is effective to increase in the ratio of a second area S2 of the second gate oxide film under the floating gate electrode to a first area S1 of the first gate oxide film.

It is, however, difficult to improve the above conventional memory device so as to increase the ratio of S2/S1, provided that the floating gate transistor structure is kept suitable for the high density integration.

It is also effective that the first gate oxide film is made of silicon oxide and the second gate oxide film is made of either a high dielectric constant film or a ferrodielectric film. In this case, there is a serious problem in that the high dielectric constant film or the ferrodielectric film tend to be deteriorated by a heat treatment at over 700° C. This means that it is impossible to use a high temperature treat treatment at over 700° C. Actually, it is necessary to subject the diffusion region to a high temperature heat treatment at approximately 800° C. For which reason, it is impossible to use either the high dielectric constant film or the ferrodielectric film for the second gate oxide film.

The above descriptions mention that is difficult to accomplish both the substantial reduction in the control voltage level and the high density integration by minor modification or mere design choice of the above conventional memory cell structure.

The above conventional memory cell structure has a further disadvantage. The word lines are patterned using a mask pattern, and subsequently the second gate oxide film and the floating gate electrode are patterned using the same mask pattern. In such sequential fine processes, it is difficult to precisely form the gate structure at a predetermined size. It is also difficult to accomplish a complete and accurate etching of the floating gate electrode. It is further difficult to avoid any damage to the first gate oxide film when the floating gate electrode is patterned by this etching.

Under the above, circumstances, it had been required to develop a quite novel memory cell structure free from any problems or disadvantages as described above.

SUMMARY OF THE INVENTION

Accordingly, it is an object of the present invention to provide a novel memory cell structure of a floating gate transistor free from any problems or disadvantages as described above.

It is a further object of the present invention to provide a novel memory cell structure of a floating gate transistor which is operational by applying a low control voltage to a control electrode.

It is a still further object of the present invention to provide a novel memory cell structure which allows a substantial scaling down of each floating gate transistor.

It is yet a further object of the present invention to provide a novel memory cell structure which facilitates a high density integration of memory cell arrays.

It is a furthermore object of the present invention to provide a novel memory cell structure which facilitates fine processes necessary for fabricating memory cell arrays.

The above and other objects, features and advantages of the present invention will be apparent from the following descriptions.

The present invention provides a floating gate electrode structure in a non-volatile semiconductor memory device. The floating gate electrode comprises a base portion, a contact portion and a head portion. The base portion horizontally extends on a first gate insulation film so as to be positioned over a channel region of a semiconductor substrate. The contact portion upwardly extends from the base portion. The contact portion is provided within a vertical contact hole formed in an inter-layer insulator covering the base portion. The inter-layer insulator encloses bit lines. The bit lines are positioned above the base portion and electrically separated by the inter-layer insulator from both the contact portion and the base port/on. The head portion horizontally extends on the inter-layer insulator to be in contact with the contact portion so that the head portion is electrically coupled to the base portion via the contact portion. The head portion is in contact with and underlies a second gate insulation film. The gate insulation film is in contact with and underlies a control electrode. The head portion is electrically separated by the inter-layer insulator from the bit lines. The area of a first interface between the base portion and the first gate insulation film is smaller than the area of a second interface between the head portion and the second gate insulation film.

The present invention also provides another floating gate electrode structure in a non-volatile semiconductor memory device. A base portion of the floating gate electrode horizontally extends on a first gate insulation film so as to be positioned over a channel region of a semiconductor substrate. An inter-layer insulator is provided to cover the base port/on. The inter-layer insulator has a contact hole. The inter-layer insulator encloses bit lines being positioned above the base portion and electrically separated by the inter-layer insulator from both the contact port/on and the base hole. A body office floating gate electrode horizontally extends on the base portion and within the contact hole. The body vertically extends on vertical walls of the contact hole and horizontally extends on a top surface of the inter-layer insulator. The body is electrically separated by the inter-layer insulator from the bit line. A second gate insulation film extends on the body residing both within the contact hole and on the top of the inter-layer insulator. The second gate insulation film is in contact with and underlies a control electrode. The control electrode resides both within the contact holes and over the top of the inter-layer insulator. The area of a first interface between the base portion and the first gate insulation film is smaller than the area of a second interface between the body and the second gate insulation film.

BRIEF DESCRIPTIONS OF THE DRAWINGS

Preferred embodiments of the present invention will be describe in detail with reference to the accompanying drawings.

DISCLOSURE OF THE INVENTION

Figure 1:
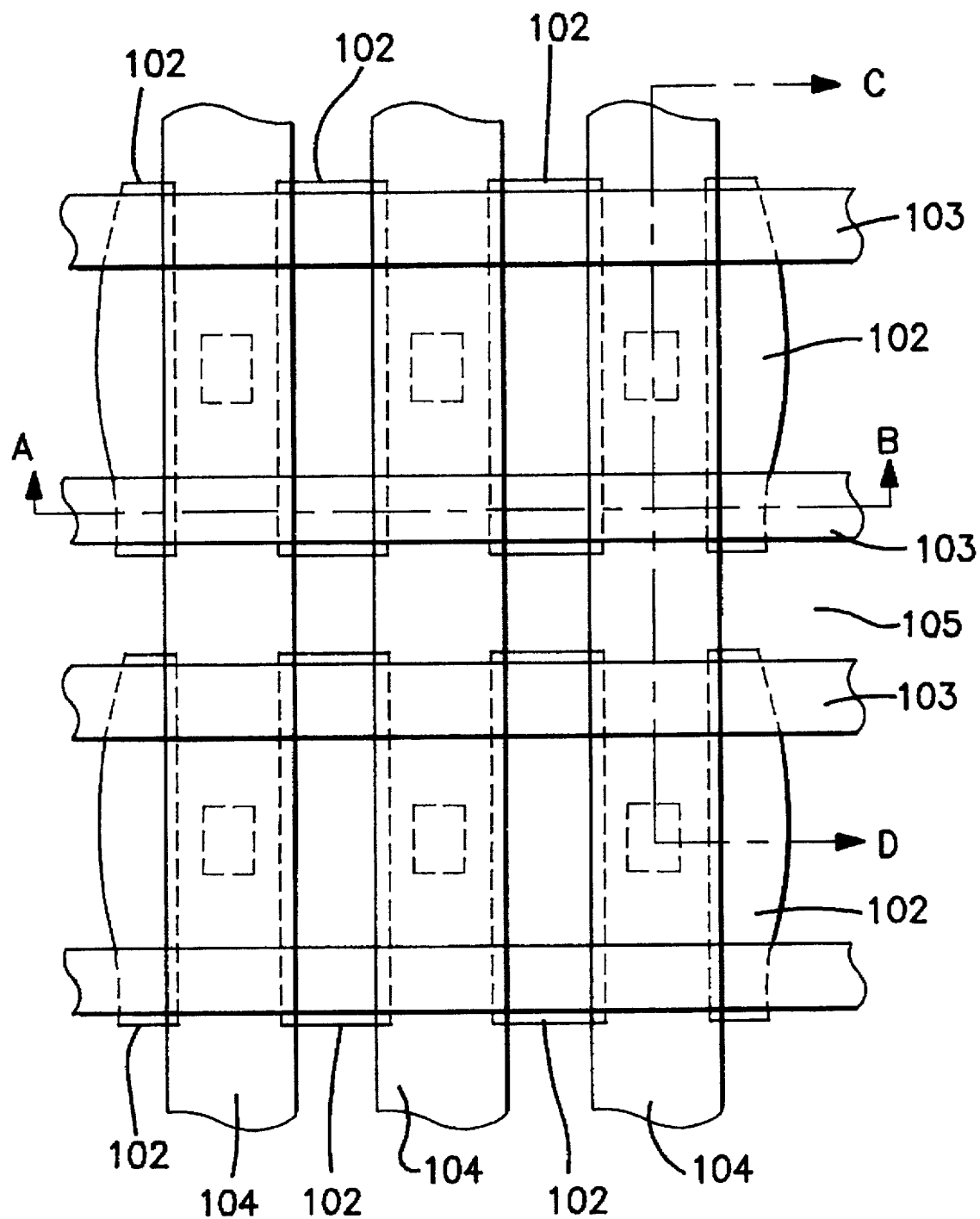
FIG. 1 is a fragmentary plane view illustrative of the conventional floating gate transistor memory cell array structure.
Figure 2A:
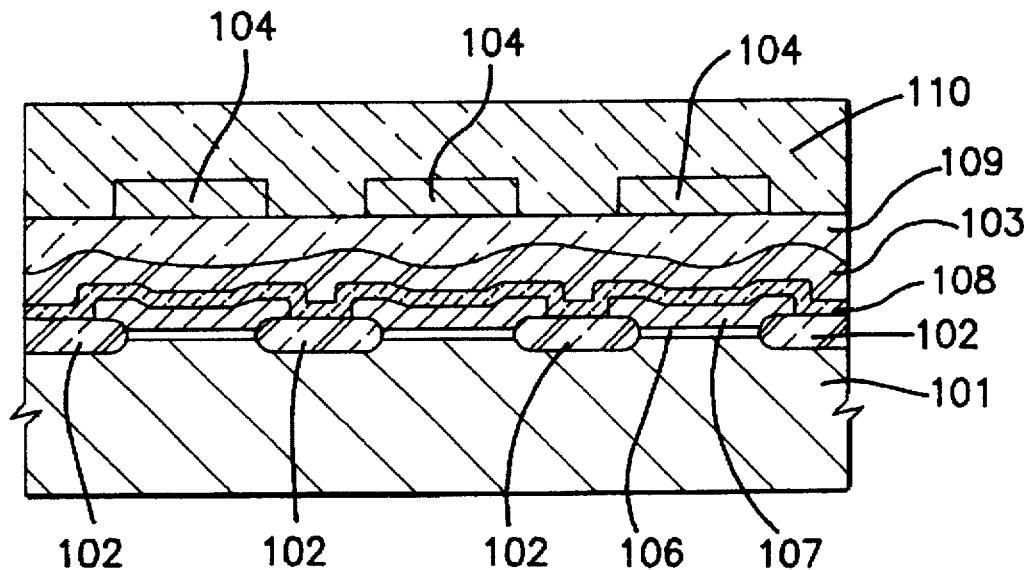
FIG. 2A is a fragmentary cross sectional elevation view along an A–B line in FIG. 1.
Figure 2B:
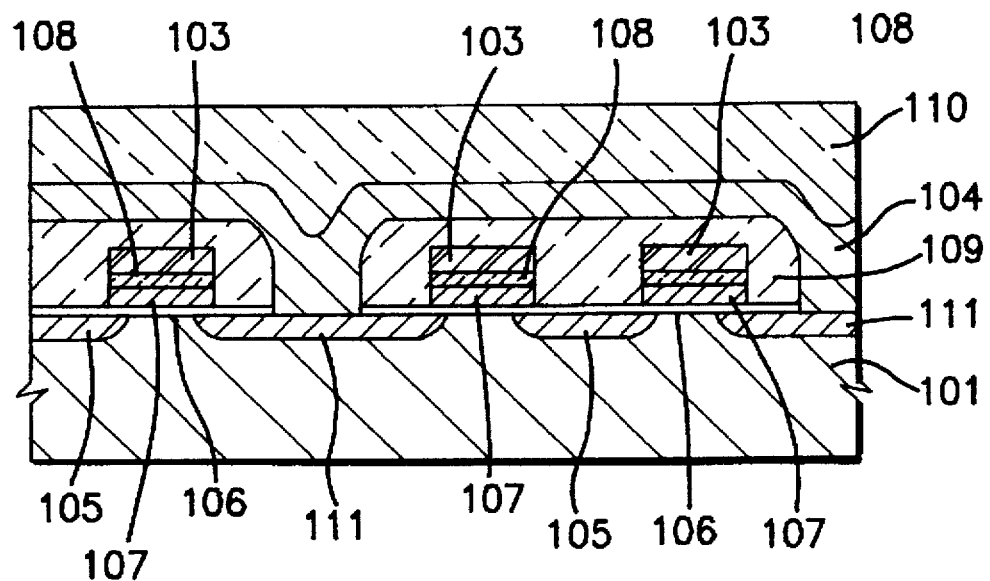
FIG. 2B is a fragmentary cross sectional elevation view along a C–D line in FIG. 1.

The present invention provides a floating gate electrode structure in a non-volatile semiconductor memory device. The floating gate electrode comprises a base portion, a contact portion and a head portion. The base portion horizontally extends on a first gate insulation film so as to be positioned over a channel region of a semiconductor substrate. The contact portion upwardly extends from the base portion. The contact portion is provided within a vertical contact hole formed in an inter-layer insulator covering the base portion. The inter-layer insulator encloses bit lines. The bit lines are positioned above the base portion and electrically separated by the inter-layer insulator from both the contact portion and the base portion. The head portion horizontally extends on the inter-layer insulator to be in contact with the contact portion so that the head portion is electrically coupled to the base portion via the contact portion. The head portion is in contact with and underlies a seemed gate insulation film. The gate insulation film is in contact with and underlies a control electrode. The head portion is electrically separated by the inter-layer insulator from the bit lines. The area of a first interface between the base portion and the first gate insulation film is smaller than the area of a second interface between the head portion and the second gate insulation film.

It is preferable that the area of the first interface between the base portion and the first gate insulation film is at most a half of the area of the second interface between the head portion and the second gate insulation film.

It is also preferable that the first gate insulation film is made of the same dielectric material as the second gate insulation film. The dielectric material may be silicon oxide.

It is also preferable that the first gate insulation film comprises a single film made of silicon oxide and the second gate insulation film comprises at least a lamination of a silicon oxide film and a silicon nitride film.

It is also preferable that the first gate insulation film is made of a first dielectric material having a first dielectric constant smaller than a second dielectric constant of which the second gate insulation film is made.

It is also preferable that the first gate insulation film is made of a material selected from the group consisting of silicon oxide, silicon nitride and silicon oxynitride, and the second gate insulation film is made of a material selected from the group consisting of tantalum oxide, strontium titanate, barium strontium titanate and zirconate lead titanate, and further the control electrode is made of a material selected from the group consisting of titanium nitride, platinum iridum oxide and ruthenium oxide.

It is also preferable that the base portion comprises a lamination of a polysilicon film doped with an impurity and a titanium nitride film on the polysilicon film.

It is also preferable that the base portion has vertical walls extending upwardly from opposite ends thereof.

It is also preferable that the base portion has a recessed portion at an upper portion thereof.

It is also preferable that the floating gate structure further includes an upper inter-layer insulator provided to embed the control electrode, the second gate insulation film and the head portion, and also includes an supplemental bit line provided on the upper inter-layer insulator so that the supplemental bit line being electrically coupled via a bit line contact to the bit line. The bit line contact is provided within a bit line contact hole provided in the inter-layer insulator and the upper inter-layer insulator.

It is also preferable that the supplemental bit line is made of aluminum.

It is also preferable that the control electrode comprises a lamination of a polysilicon film and a tungsten silicide film on the polysilicon film.

The present invention provides another floating gate electrode structure in a non-volatile semiconductor memory device. A base portion of the floating gate electrode horizontally extends on a first gate insulation film so as to be positioned over a channel region of a semiconductor substrate. An inter-layer insulator is provided to cover the base portion. The inter-layer insulator has a contact hole. The inter-layer insulator encloses bit lines being positioned above the base portion and electrically separated by the inter-layer insulator from both the contact portion and the base hole. A body of the floating gate electrode horizontally extends on the base portion and within the contact hole. The body vertically extends on vertical walls of the contact hole and horizontally extends on a top surface of the inter-layer insulator. The body is electrically separated by the inter-layer insulator from the bit line. A second gate insulation film extends on the body residing both within the contact hole and on the top of the inter-layer insulator. The second gate insulation film is in contact with and underlies a control electrode. The control electrode resides both within the contact holes and over the top of the inter-layer insulator. The area of a first interface between the base portion and the first gate insulation film is smaller than the area of a second interface between the body and the second gate insulation film.

It is preferable that the area of the first interface between the body and the first gate insulation film is at most a half of the area of the second interface between the head portion and the second gate insulation film.

It is also preferable that the first gate insulation film is made of the same dielectric material as the second gate insulation film. The dielectric material may be silicon oxide.

It is also preferable that the first gate insulation film comprises a single film made of silicon oxide and the second gate insulation film comprises at least a lamination of a silicon oxide film and a silicon nitride film.

It is also preferable that the first gate insulation film is made of a first dielectric material having a first dielectric constant smaller than a second dielectric constant of which the second gate insulation film is made.

It is also preferable that the first gate insulation film is made of a material selected from the group consisting of silicon oxide, silicon nitride and silicon oxynitride, and the second gate insulation film is made of a material selected from the group consisting of tantalum oxide, strontium titanate, barium strontium titanate and zirconate lead titanate, and further the control electrode is made of a material selected from the group consisting of titanium nitride, platinum iridum oxide and ruthenium oxide.

It is also preferable that the body comprises a lamination of a polysilicon film doped with an impurity and a titanium nitride film on the polysilicon film.

It is also preferable that the body has vertical walls extending upwardly from opposite ends thereof.

It is also preferable that the body has a recessed portion at an upper portion thereof.

It is also preferable that the floating gate structure further includes an upper inter-layer insulator provided to embed the control electrode, the second gate insulation film and the head portion, and also includes an supplemental bit line provided on the upper inter-layer insulator so that the supplemental bit line being electrically coupled via a bit line contact to the bit line. The bit line contact is provided within a bit line contact hole provided in the inter-layer insulator and the upper inter-layer insulator.

It is also preferable that the supplemental bit line is made of aluminum.

It is also preferable that the control electrode comprises a lamination of a polysilicon film and a tungsten silicide film on the polysilicon film.

Figure 3:
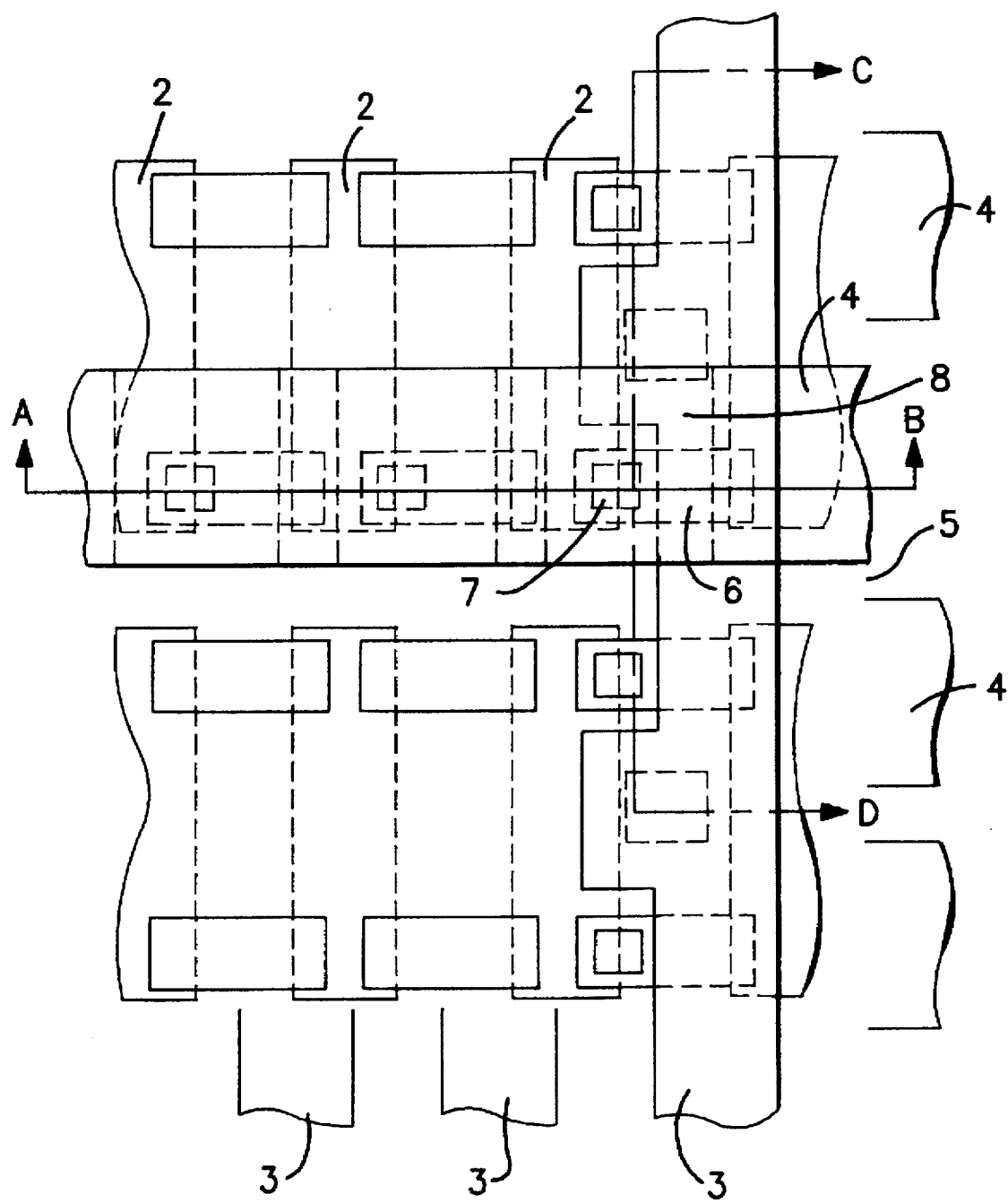
FIG. 3 is a plane view illustrative of a novel floating gate transistor memory cell array structure in a first embodiment according to the present invention.

A first embodiment according to the present invention will be described with reference to FIGS. 3, 4A and 4B. A novel floating gate transistor memory cell array structure is provided on a silicon substrate 1. As illustrated in FIG. 3, field oxide films 2 are selectively formed on a surface of the silicon substrate 1 to define active regions. Regions on which the field oxide films 2 are formed are passive regions, while regions on which any field oxide film 2 is not formed are the active region. On the active region, a multi-gate structure and source/drain diffusion regions are provided. Word lines 3 are formed in parallel to each other. Bit lines 4 are formed above the word lines 3. The bit lines are parallel to each other in a perpendicular direction to a direction of the word lines 3. The bit lines 4 transmit write/read signals.

The novel floating gate transistor memory cell array structure includes a multi-gate structure having a single control electrode formed of a part of a word line 4 and double floating gate electrodes named as first and second floating gate electrodes 6 and 8. In the memory cell arrays, many multi-gate structures are integrated on the silicon substrate. The first and second floating gate electrodes 6 and 8 are arranged to make pairs so that each paired first and second floating gate electrodes 6 and 8 are electrically connected via a floating gate contact 7.

Figure 4A:
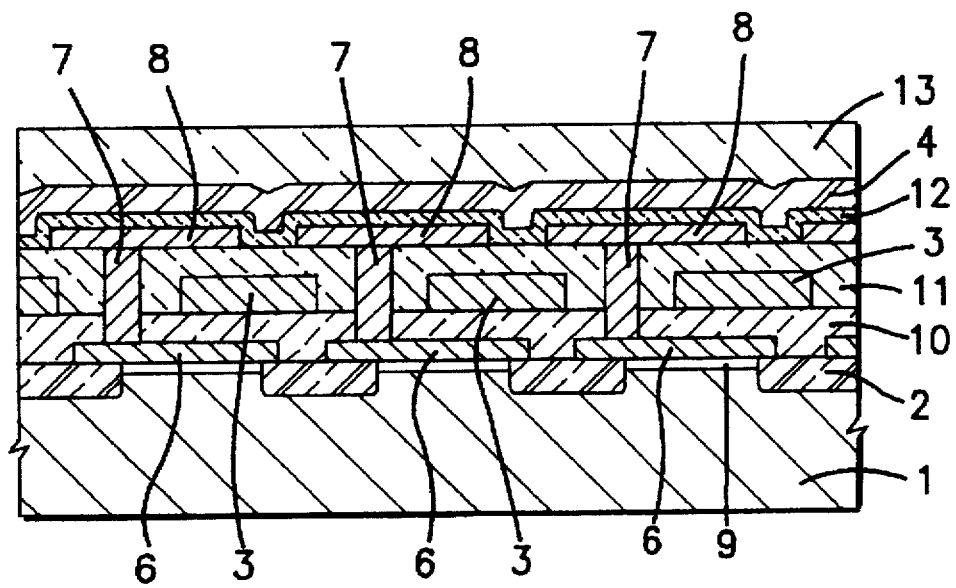
FIG. 4A is a fragmentary cross sectional elevation view along an A–B line in FIG. 3 in a first embodiment according to the present invention.
Figure 4B:
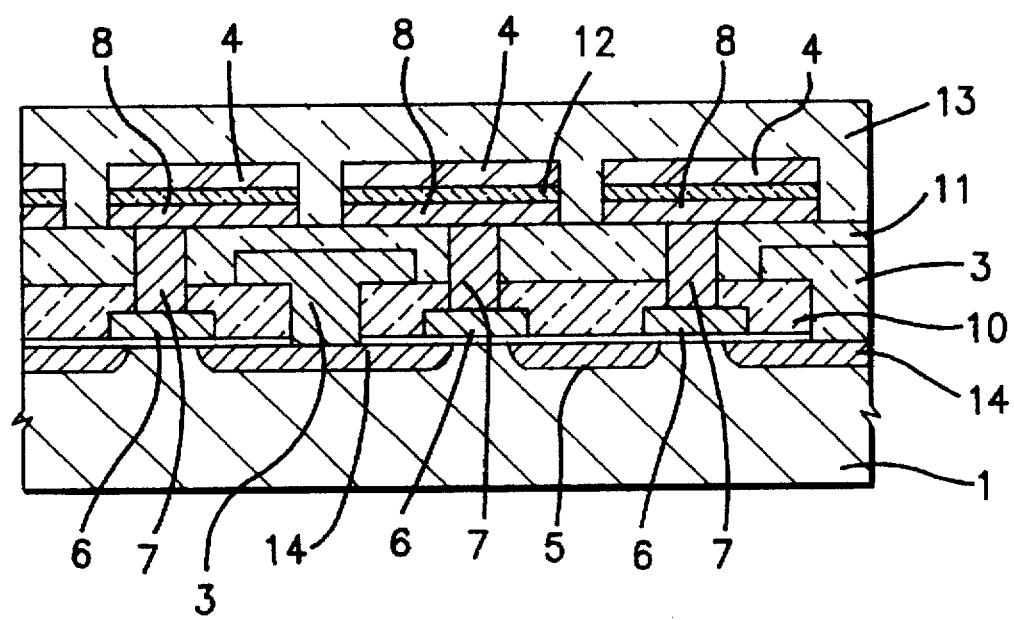
FIG. 4B is a fragmentary cross sectional elevation view along a C–D line in FIG. 3 in a first embodiment according to the present invention.

With reference to FIG. 4A, the detail structure of the memory cell arrays will be highlighted. The field oxide films 2 are selectively formed on passive regions of the surface of the silicon substrate 1. A first gate oxide film 9 having a thickness in the range of 5 to 10 nanometers is selectively provided on active regions bounded by the field oxide films 9. First floating gate electrodes 6 are selectively provided on the first gate oxide films 9 on the active regions. Each of the first floating gate electrode 6 comprises a lamination of a phosphorus-doped polysilicon film with a thickness of approximately 50 nanometers and a titanium nitride film having a thickness of approximately 50 nanometers and being deposited on the polysilicon film.

A first inter-layer insulator 10 is entirely provided to cover the first floating gate electrodes 6 and the field oxide films 2. The first inter-layer insulator 10 has through holes positioned over the individual first floating gate electrodes 6. Bit lines 3 are formed on the first inter-layer insulator 10. The bit lines 3 are positioned separately from the through holes. The role of the bit lines 3 is to transmit write/read signals. The bit lines 3 may be made of high melting point metals such as W and Ti or silicides thereof. A second inter-layer insulator 11 is entirely provided to cover the bit lines 3 and the first inter-layer insulator 10. Each of the first and second inter-layer insulators 10 and 11 may comprise a silicon oxide film formed by the chemical vapor deposition and subsequent chemical mechanical polishing. Alternatively, each of the first and second inter-layer insulators 10 and 11 may comprise a boron-phosphate-silicate-glass film with a thermal flexibility. In any event, the first and second inter-layer insulators 10 and 11 have level surfaces. The second inter-layer 11 also has through holes positioned over the through holes office flint inter-layer insulator 10. The through holes of the first and second inter-layer insulators 10 and 11 may be formed by dry etching. The through holes of the first and second inter-layer insulators 10 and 11 making a pair constitute a contact hole. The titanium nitride film constituting the first floating gate electrode 6 has a resistance to the dry etching. In the contact holes, the floating gate contacts 7 are provided, which are made of phosphorus-doped polysilicon so flint the floating gate contacts 7 are in contact with the first floating gate electrodes.

Second floating gate electrodes 8 are provided on the second inter-layer insulator 11 so that the second floating gate electrodes 8 are in contact with the first floating gate electrodes 6 via the floating gate contacts 7 thereby the second floating gate electrodes 8 are made pair with the first floating gate electrodes 6.

A second gate oxide film 12 is entirely provided to cover the second floating gate electrodes 8 and the seceded inter-layer insulator 11. The second gate oxide film 12 comprises a lamination of a silicon oxide film and a silicon nitride film.

Word lines 4 are formed on the: second gate oxide films. The word lines 4 over the second floating gate electrodes 8 serve as control gaze electrodes. The word lines 4 serving as the control gate electrodes comprise laminations of a phosphorus-doped polysilicon film with a thickness of 200 nanometers and a tungsten silicide film 200 nanometers. The phosphorus doped polysilicon film is formed by a chemical vapor deposition using a growth temperature in the range of 550° C. to 650° C. The tungsten silicide film is formed by sputtering at a low temperature below 650° C. A third inter-layer insulator 13 is entirely formed to cover the word lines 4 and the second gate oxide film 12.

Supplemental descriptions to the novel memory cell structure will be made with reference to FIG. 4B. Source/drain diffusion regions 5 and 14 are selectively provided in an upper region of the silicon substrate 1 to define channel regions. The first gate oxide film 9 are provided on the surface of the silicon substrate 1. The first floating gate electrodes 6 are provided over the channel regions. The first inter-layer insulator 10 is provided to embed the first floating gate electrodes 6. The first inter-layer insulator 10 has contact holes over the diffusion regions 14. The bit lines 3 are provided over the diffusion region 14 and within the contact holes so that the bit lines 3 are in contact with the diffusion regions 14. The second inter-layer insulator 11 is provided to cover the bit lines 3 and the first inter-layer insulator 10. The second inter-layer insulator 11 has through holes positioned over the contact holes of the first inter-layer insulator 10 so that the paired through holes make a single contact hole. In the contact holes of the first and second inter-layer insulators 10 and 11, the floating gate contacts 7 are formed to be in contact with the first floating gate electrodes 6. The second floating gate electrodes 8 are selectively provided so that they are in contact with the first floating gate electrodes 6 via the floating gate contacts 7. The second gate oxide films 12 are selectively formed on the second floating gate electrodes 8. The word lines 4 are formed on the second gate oxide films 12. The third interlayer insulator 13 are provided to cover the word lines 4 and the second inter-layer insulator 11.

As described above, the bit lines 3 are provided above the first floating gate electrodes 6 and below the second gate electrodes 8. The first floating gate 6 is provided on the first gate oxide film 9 positioned on the channel region. The first and second floating gate electrodes 6 and 8 are coupled via the floating gate contact 7. The second gate oxide film 12 is formed on the second floating gate electrode 8. The second floating gate electrode 8 has a lager area than an area of the first floating gate oxide film 6. The second gate oxide film 12 has the same size as the second floating gate electrode 8. Thus, the area of the second gate oxide film 12 on the second floating gate electrode 8 is larger than the area of the first floating gate electrode 6. Therefore, the area of the second gate oxide film 12 in contact with the second floating gate electrode 8 is larger than the area of the first gate oxide film 9 in contact with the first floating gate electrode 6. The gate structure is regarded as comprising first and second capacitors. The first capacitor comprises the channel region, the first floating gate electrode 6 and the first gate oxide film in contact with the first floating gate electrode 6. The second capacitor comprises the second floating gate electrode 8, the second gate oxide film 12 and the control gate electrode 4. The ratio of S2, the area of the second gate oxide film, to S1, the area of the first gate oxide film in contact with the first floating gate electrode 6 is approximately 4. This structure provides a large ratio office capacity of the second capacitor to the capacity of the first capacitor, thereby resulting in an increased electric field across the first gate oxide film. This can facilitate electron injection into or discharge from the first floating gate electrode 6 electrically coupled via the floating gate contact 7 to the second floating gate electrode 8. The necessary control voltage to be applied to the control electrode or the word line 4 is reduced to approximately a half of that necessary when the ratio of S2/S1 is approximately 1. The above memory cell structure allows the necessary control voltage level to be considerably reduced to a half of that needed by the conventional memory cell structure. This results in a substantial reduction of the power consumption.

The second capacitor of the mommy cell is fabricated in the last process. The heat treatment is carried out at a low temperature of 650° C. For this reason, either a dielectric film with a high dielectric constant or a ferrodielectric film is available for the second gate oxide film 12 so as to increase the ratio of the capacity of the second capacitor to the capacity of the first capacitor. As the dielectric film tantalum oxide, strontium titanium oxide, barium strontium titanate, zirconate lead titanate are for example available. In this case, the word line 4 on the second gate oxide film 12 should be made of materials which show no chemical reaction with the above chemical substances. For example, TiN, Pt, iridium oxide and ruthenium oxide are available. This structure provides a largely increased ratio of the capacity of the second capacitor to the capacity of the first capacitor, thereby resulting in a largely increased electric field across the first gate oxide film. This can further facilitate electron injection into or discharge from the first floating gate electrode 6. The necessary control voltage to be applied to the control electrode or the word line 4 is reduced to approximately a quarter of that necessary for the conventional memory device. The above memory cell structure allows the necessary control voltage level to be considerably reduced to a quarter of that needed by the conventional memory cell structure. This results in a considerable reduction of the power consumption.

The second capacitor, which comprises the second floating gate electrode 8, the second gate oxide film 12 and the control gate electrode 4, are formed by the dry etching and positioned above the first gate oxide film and the silicon substrate 1. For this reason, the first gate oxide film 9 and the silicon substrate 1 are free from any damage due to the dry etching process. The surface of the second inter-layer insulator 11 are level on which the second floating gate electrode 8, the second gate oxide film 12 and the control gate electrode 4 are formed by dry etching. This makes it easy to do complete and accurate patterning.

A second embodiment according to the present invention will be described with reference to FIGS. 3, 4B and 5. A novel floating gate transistor memory cell array structure is provided on a silicon substrate 1 . As illustrated in FIG. 3, field oxide films 2 are selectively formed on a surface of the silicon substrate 1 to define active regions. Regions on which the field oxide films 2 are formed are passive regions, while regions on which any filed oxide film 2 is not formed are the active region. On the active region, a multi-gate structure and source/drain diffusion regions are provided. Word lines 3 are formed in parallel to each other. Bit lines 4 are formed above the word lines 3. The bit lines are parallel to each other in a perpendicular direction to a direction of the word lines 3. The bit lines 4 transmit write/read signals.

The novel floating gate transistor memory cell array structure includes a multi-gate structure having a single control electrode formed of a part of a word line 4 and double floating gate electrodes named as first and second floating gate electrodes 6 and 8. In the memory cell arrays, many multi-gate structures are integrated on the silicon substrate. The first and second floating gate electrodes 6 and 8 are arranged to make pairs so that each paired first and second floating gate electrodes 6 and 8 are electrically connected via a floating gate contact 7.

Figure 5:
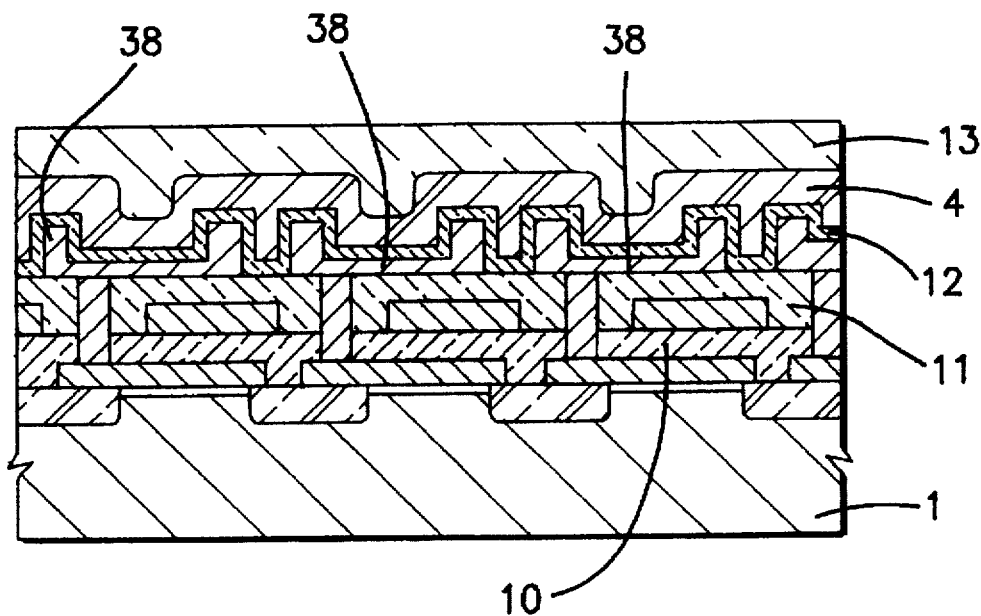
FIG. 5 is a fragmentary cross sectional elevation view illustrative of a novel floating gate transistor memory cell array structure in a second embodiment according to the present invention.

With reference to FIG. 5, the detail structure of the memory cell arrays will be highlighted. The field oxide films 2 are selectively formed on passive regions of the surface of the silicon substrate 1. At first gate oxide film 9 having a thickness in the range of 5 to 10 nanometers is selectively provided on active regions bounded by the field oxide films 9. First floating gate electrodes 6 are selectively provided on the first gate oxide films 9 on the active regions. Each of the first floating gate electrode 6 comprises a lamination of a phosphorus-doped polysilicon film with a thickness of approximately 50 nanometers and a titanium nitride film having a thickness of approximately 50 nanometers and being deposited on the polysilicon film.

A first inter-layer insulator 10 is entirely provided to cover the first floating gate electrodes 6 and the field oxide films 2. The first inter-layer insulator 10 has through holes positioned over the individual first floating gate electrodes 6. Bit lines 3 are formed on the first inter-layer insulator 10. The bit lines 3 are positioned separately from the through holes. The role of the bit lines 3 is to transmit write/read signals. The bit lines 3 may be made of high melting point metals such as W and Ti or silicides thereof. A second inter-layer insulator 11 is entirely provided to cover the bit lines 3 and the first inter-layer insulator 10. Each of the first and second inter-layer insulators 10 and 11 may comprise a silicon oxide film formed by the chemical vapor deposition and subsequent chemical mechanical polishing. Alternatively, each of the first and second inter-layer insulators 10 and 11 may comprise a boron-phosphate-silicate-glass film with a thermal flexibility. In any event, the first and second inter-layer insulators 10 and 11 have level surfaces. The second interlayer 11 also has through holes positioned over the through holes of the first inter-layer insulator 10. The through holes of the first and second inter-layer insulators 10 and 11 may be formed by dry etching. The through holes of the first and second inter-layer insulators 10 and 11 making a pair constitute a contact hole. The titanium nitride film constituting the first floating gate electrode 6 has a resistance to the dry etching. In the contact holes, the floating gate contacts 7 are provided, which are made of phosphorus-doped polysilicon so that the floating gate contacts 7 are in contact with the first floating gate electrodes.

Second floating gate electrodes 38 are provided on the second inter-layer insulator 11 so that the second floating gate electrodes 38 are in contact with the first floating gate electrodes 6 via the floating gate contacts 7 thereby the second floating gate electrodes 38 are made pair with the first floating gate electrodes 6. The second floating gate electrode 38 has a U-shape. The second floating gate electrode 38 extends upward at opposite ends as illustrated in FIG. 5. The second U-shaped floating gate electrode 38 may be regarded as comprising a base and vertical walls positioned at opposite ends of the base. The second U-shaped floating gate electrode 38 may be formed as follows. At first, a phosphorus-doped polysilicon film with a thickness of approximately 100 nanometers is deposited on the entire surface of the second inter-layer insulator 11. An insulation mask pattern is formed on the phosphorus-doped polysilicon film. The deposition of the phosphorus-doped polysilicon film is again carried out using the insulation mask pattern so that elevated phosphorus-doped polysilicon portions are formed. By removal of the insulation mask pattern, recessed portions are shaped. Then, an anisotropic etching is carried out to pattern the polysilicon film thereby resulting in the U-shaped phosphorus-doped polysilicon film which constitutes the second U-shaped floating gate electrode 38.

A second gate oxide film 12 is entirely provided to cover the second U-shaped floating gate electrodes 38 and the second inter-layer insulator 11. The second gate oxide film 12 comprises a lamination of a silicon oxide film and a silicon nitride film. The second U-shaped floating gate electrode 38 has an increased interface area to the second gate oxide film 12 as compared to that of the first embodiment.

Word lines 4 are formed on the second gate oxide films 12 with the increased area. The word lines 4 over the second floating gate electrodes 38 serve as control gate electrodes. The word lines 4 sewing as the control gate electrodes comprise laminations of a phosphorus-doped polysilicon film with a thickness of 200 nanometers and a tungsten silicide film 200 nanometers. The phosphorus doped polysilicon film is formed by a chemical vapor deposition using a growth temperature in the range of 550° C. to 650° C. The tungsten silicide film is formed by sputtering at a low temperature below 650° C. The word line 4 has an increased interface area to the second gate oxide film 12. As a result, the second gate oxide film 12 has increased interface areas to the second U-shaped floating electrode 38 and to the word lines 4. A third inter-layer insulator 13 is entirely formed to cover the word lines 4 and the second gate oxide film 12.

Supplemental descriptions to the novel memory cell structure will be made with reference back to FIG. 4B. Source/drain diffusion regions 5 and 14 are selectively provided in an upper region of the silicon substrate 1 to define channel regions. The first gate oxide film 9 is provided on the surface of the silicon substrate 1. The first floating gate electrodes 6 are provided over the channel regions. The first inter-layer insulator 10 is provided to embed the first floating gate electrodes 6. The first inter-layer insulator 10 has contact holes over the diffusion regions 14. The bit lines 3 are provided over the diffusion region 14 and within the contact holes so that the bit lines 3 are in contact with the diffusion regions 14. The second inter-layer insulator 11 is provided to cover the bit lines 3 and the first inter-layer insulator 10. The second inter-layer insulator 11 has through holes positioned over the contact holes of the first inter-layer insulator 10 so that the paired through holes make a single contact hole. In the contact holes of the first and second inter-layer insulators 10 and 11, the floating gate contacts 7 are formed to be in contact with the first floating gate electrodes 6. The second floating gate electrodes 38 are selectively provided so that they are in contact with the first floating gate electrodes 6 via the floating gate contacts 7. The second gate oxide films 12 are selectively formed on the second floating gate electrodes 38. The word lines 4 are formed on the second gate oxide films 12. The third inter-layer insulator 13 is provided to cover the word lines 4 and the second inter-layer insulator 11.

As described above, the bit lines 3 are provided above the first floating gate electrodes 6 and below the second gate electrodes 38. The first floating gate 6 is provided on the first gate oxide film 9 positioned on the channel region. The first and second floating gate electrodes 6 and 38 are coupled via the floating gate contact 7. The second gate oxide film 12 is formed on the second floating gate electrode 38. The second floating gate electrode 38 has a lager area than an area of the first floating gate oxide film 6. The second gate oxide film 12 has the same size as the second U-shaped floating gate electrode 38. Thus, the area of the second gate oxide film 12 on the second floating gate electrode 38 is larger than the area of the first floating gate electrode 6. Therefore, the area of the second gate oxide film 12 in contact with the second floating gate electrode 38 is larger than the area of the first gate oxide film 9 in contact with the first floating gate electrode 6. The gate structure is regarded as comprising first and second capacitors. The first capacitor comprises the channel region, the first floating gate electrode 6 and the first gate oxide film in contact with the first floating gate electrode 6. The second capacitor comprises the second U-shaped floating gate electrode 38, the second gate oxide film 12 and the control gate electrode 4. The ratio of S2, the area of the second gate oxide film, to S1, the area of the first gate oxide film in contact with the first floating gate electrode 6 is approximately 8. This structure provides a large ratio of the capacity of the second capacitor to the capacity of the first capacitor, thereby resulting in an increased electric field across the first gate oxide film. This can facilitate electron injection into or discharge from the first floating gate electrode 6 electrically coupled via the floating gate contact 7 to the second U-shaped floating gate electrode 38. The necessary control voltage to be applied to the control electrode or the word line 4 is reduced to approximately $1/(2\sqrt{2})$ of that necessary when the ratio of S2/S1 is approximately 1. The above memory cell structure allows the necessary control voltage level to be considerably reduced to a half of that needed by the conventional memory cell structure. This results in a substantial reduction of the power consumption.

The second capacitor of the memory cell is fabricated in the last process. The heat treatment is carried out at a low temperature of 650° C. For this reason, either a dielectric film with a high dielectric constant or a ferrodielectric film is available for the second gate oxide film 12 so as to increase the ratio of the capacity of the second capacitor to the capacity of the first capacitor. As the dielectric film, tantalum oxide, strontium titanium oxide, barium strontium titanate, zirconate lead titanate are for example available. In this case, the word line 4 on the second gate oxide film 12 should be made of materials which show no chemical reaction with the above chemical substances. For example, TiN, Pt, iridium oxide and ruthenium oxide are available. This structure provides a largely increased ratio of the capacity of the second capacitor to the capacity of the first capacitor, thereby resulting in a largely increased electric field across the first gate oxide film. This can further facilitate electron inject/on into or discharge from the first floating gate electrode 6. The necessary control voltage to be applied to the control electrode or the word line 4 is reduced to approximately a quarter of that necessary for the conventional memory device. The above memory cell structure allows the necessary control voltage level to be considerably reduced to a quarter of that needed by the conventional memory cell structure. This results in a considerable reduction of the power consumption.

The second capacitor, which comprises the second floating gate electrode 38, the second gate oxide film 12 and the control gate electrode 4, are formed by the dry etching and positioned above the first gate oxide film and the silicon substrate 1. For this reason, the first gate oxide film 9 and the silicon substrate 1 are free from any damage due to the dry etching process. The surface of the second interlayer insulator 11 are level on which the second floating gate electrode 38, the second gate oxide film 12 and the control gate electrode 4 are formed by the dry etching. This makes it easy to do complete and accurate patterning.

A third embodiment according to the present invent/on will be described with reference to FIGS. 3, 4B and 6. A novel floating gate transistor memory cell array structure is provided on a silicon substrate 1. As illustrated in FIG. 3, field oxide films 2 are selectively formed on a surface of the silicon substrate 1 to define active regions. Regions on which the field oxide films 2 are formed are passive regions, while regions on which any filed oxide film 2 is not formed are the active region. On the active region, a multi-gate structure and source/drain diffusion regions are provided. Word lines 3 are formed in parallel to each other. Bit lines 4 are formed above the word lines 3. The bit lines are parallel to each other in a perpendicular direction to a direction of the word lines 3. The bit lines 4 have role to transmit write/read signals.

The novel floating gate transistor memory cell array structure includes a multi-gate structure having a single control electrode formed of a part of a word line 4 and double floating gate electrodes named as first and second floating gate electrodes 6 and 48. In the memory cell arrays, many multi-gate structures are integrated on the silicon substrate. The first and second floating gate electrodes 6 and 48 are arranged to make pairs so that each paired first and second floating gate electrodes 6 and 48 are electrically connected via a floating gate contact 7.

Figure 6:
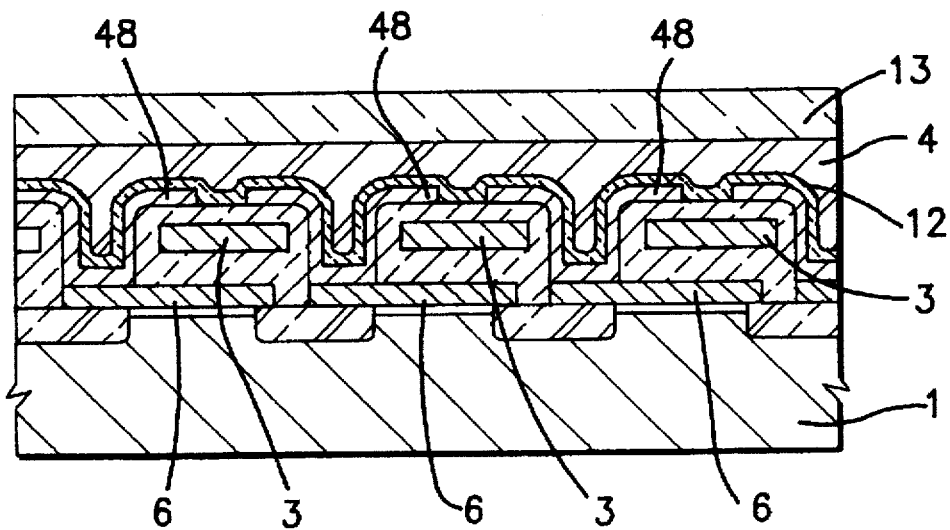
FIG. 6 is a fragmentary cross sectional elevation view illustrative of a novel floating gate transistor memory cell array structure in a third embodiment according to the present invention.

With reference to FIG. 6, the detail structure of the memory cell arrays will be highlighted. The field oxide films 2 are selectively formed on passive regions of the surface of the silicon substrate 1. A first gate oxide film 9 having a thickness in the range of 5 to 10 nanometers is selectively provided on active regions bounded by the field oxide films 9. First floating gate electrodes 6 are selectively provided on the first gate oxide films 9 on the active regions. Each the first floating gate electrode 6 comprises a lamination of a phosphorus-doped polysilicon film with a thickness of approximately 50 nanometers and a titanium nitride film having a thickness of approximately 50 nanometers and being deposited on the polysilicon film.

A first inter-layer insulator 10 is entirely provided to cover the first floating gate electrodes 6 and the field oxide films 2. The first inter-layer insulator 10 has large through holes positioned over the individual first floating gate electrodes 6. Bit lines 3 are formed on the first inter-layer insulator 10. The bit lines 3 are positioned separately from the through holes. The role of the bit lines 3 is to transmit write/read signals. The bit lines 3 may be made of high melting point metals such as W and Ti or silicides thereof. A second inter-layer insulator 11 is entirely provided to cover the bit lines 3 and the first inter-layer insulator 10. Each of the first and second inter-layer insulators 10 and 11 may comprise a silicon oxide film formed by the chemical vapor deposition and subsequent chemical mechanical polishing. Alternatively, each of the first and second inter-layer insulators 10 and 11 may comprise a boron-phosphate-silicate-glass film with a thermal flexibility. In any event, the first and second inter-layer insulators 10 and 11 have level surfaces. The second inter-layer 11 also has large through holes positioned over the large through holes of the first inter-layer insulator 10. The large through holes of the first and second inter-layer insulators 10 and 11 may be formed by dry etching. The large through holes of the first and second inter-layer insulators 10 and 11 making a pair constitute a large contact hole. The titanium nitride film constituting the first floating gate electrode 6 has a resistance to the dry etching.

Second floating gate electrodes 48 are provided on the second inter-layer insulator 11 and within the large contact holes so that the second floating gate electrodes 48 are in contact directly with the first floating gate electrodes 6 thereby the second floating gate electrodes 48 are made pair with the first floating gate electrodes 6. The second floating gate electrode 48 has a U-shape. The second floating gate electrode 48 extends on vertical walls of the large contact holes and on the top surface of the second inter-layer insulator 11 as illustrated in FIG. 6. The second U-shaped floating gate electrode 48 may be regarded as comprising a U-shaped base and horizontal upper portions.

A second gate oxide film 12 is entirely provided to cover the second U-shaped floating gate electrodes 48 and the second inter-layer insulator 11. As a result, the second gate oxide film 12 is formed not only over the second inter-layer insulator 11 but also within the large contact holes. The second gate oxide film 12 comprises a lamination of a silicon oxide film and a silicon nitride film. The second U-shaped floating gate electrode 48 has an increased interface area to the second gate oxide film 12 as compared to that of the first embodiment.

Word lines 4 are formed on the second gate oxide films 12 with the increased area so that the word lines are positioned not only over the second inter-layer insulator 11 but also within the large contact holes. As a result, the large contact holes are filled with the first floating gate electrode 48, the second gate oxide film 12 and the word lines 4. The word lines 4 over the second floating gate electrodes 48 serve as control gate electrodes. The word lines 4 serving as the control gate electrodes comprise laminations of a phosphorus-doped polysilicon film with a thickness of 200 nanometers and a tungsten silicide film 200 nanometers. The phosphorus doped polysilicon film is formed by a chemical vapor deposition using a growth temperature in the range of 550° C. to 650° C. The tungsten silicide film is formed by sputtering at a low temperature, below 650° C. The word line 4 has an increased interface area to the second gate oxide film 12. As a result, the second gate oxide film 12 has increased interface areas to the second U-shaped floating electrode 48 and to the word lines 4. A third inter-layer insulator 13 is entirely formed to cover the word lines 4 and the second gate oxide film 12.

As described above, the second U-shaped floating gate electrode 48 has a lager area than an area of the first floating gate oxide film 6. The second gate oxide film 12 has the same size as the second U-shaped floating gate electrode 48. Thus, the area of the second gate oxide film 12 on the second floating gate electrode 48 is larger than the area of the first floating gate electrode 6. Therefore, the area of the second gate oxide film 12 in contact with the second floating gate electrode 48 is larger than the area of the first gate oxide film 9 in contact with the first floating gate electrode 6. The gate structure is regarded as comprising first and second capacitors. The first capacitor comprises the channel region, the first floating gate electrode 6 and the first gate oxide film in contact with the first floating gate electrode 6. The second capacitor comprises the second U-shaped floating gate electrode 48, the second gate oxide film 12 and the control gate electrode 4. The ratio of S2, the area of the second gate oxide film, to S1, the area of the first gate oxide film in contact with the first floating gate electrode 6 is at least approximately 8. This structure provides a large ratio of the capacity of the second capacitor to the capacity of the first capacitor, thereby resulting in an increased electric field across the first gate oxide film. This can facilitate electron injection into or discharge from the first floating gate electrode 6 electrically coupled directly to the second U-shaped floating gate electrode 48. The necessary control voltage to be applied to the control electrode or the word line 4 is reduced to at most approximately $1/(2\sqrt{2})$ of that necessary when the ratio of S2/S1 is approximately 1. The above memory cell structure allows the necessary control voltage level to be considerably reduced to a half of that needed by the conventional memory cell structure. This results in a substantial reduction of the power consumption.

The second capacitor of the memory cell is fabricated in the last process. The heat treatment is carried out at a low temperature of 650° C. For this reason, either a dielectric film with a high dielectric constant or a ferrodielectric film is available for the second gate oxide film 12 so as to increase the ratio of the capacity of the second capacitor to the capacity of the first capacitor. As the dielectric film, tantalum oxide, strontium titanium oxide, barium strontium titanate, zirconate lead titanate are for example available. In this case, the word line 4 on the second gate oxide film 12 should be made of materials which show no chemical reaction with the above chemical substances. For example, TiN, Pt, iridium oxide and ruthenium oxide are available. This structure provides a largely increased ratio of the capacity of the second capacitor to the capacity of the first capacitor, thereby resulting in a largely increased electric field across the first gate oxide film. This can further facilitate electron injection into or discharge from the first floating gate electrode 6. The necessary control voltage to be applied to the control electrode or the word line 4 is reduced to at most approximately a quarter of flint necessary for the conventional memory device. The above memory cell structure allows the necessary control voltage level to be considerably reduced to at most a quarter of that needed by the conventional memory cell structure. This results in a considerable reduction of the power consumption.

As a modification of the first, second and third embodiments, the first gate oxide film is made of a dielectric film with a higher dielectric constant than that of silicon oxide. For example, a silicon nitride film or a silicon oxynitride film are available.

A fourth embodiment according to the present invention will be described with reference to FIGS. 7A and 7B. A novel floating gate transistor memory cell array structure is provided on a silicon substrate 1.

Figure 7A:
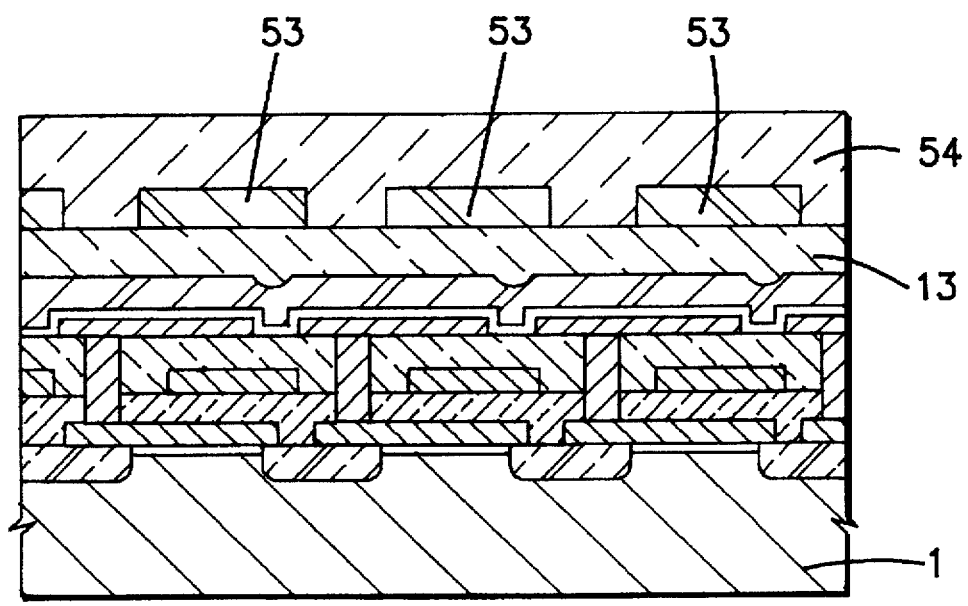
FIGS. 7A and 7B are fragmentary cross sectional elevation views illustrative of a novel floating gate transistor memory cell array structure in a fourth embodiment according to the present invention.
Figure 7B:
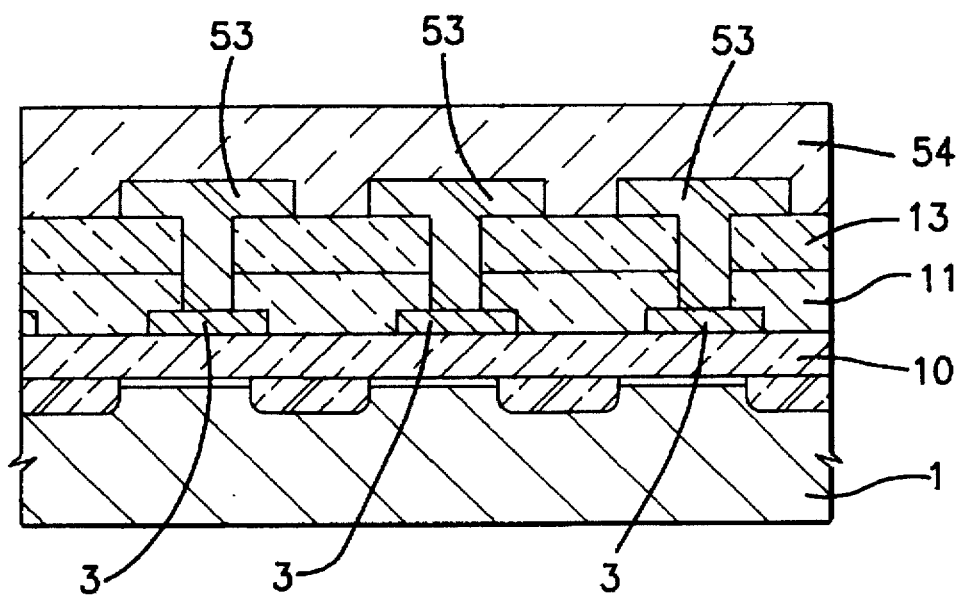

With reference to FIG. 7A, the detail structure of the memory cell arrays will be highlighted. The field oxide films 2 are selectively formed on passive regions of the surface of the silicon substrate 1. A first gate oxide film 9 having a thickness in the range of 5 to 10 nanometers is selectively provided on active regions bounded by the field oxide films 9. First floating gate electrodes 6 are selectively provided on the first gate oxide films 9 on the active regions. Each the first floating gate electrode 6 comprises a lamination of a phosphorus-doped polysilicon film with a thickness of approximately 50 nanometers and a titanium nitride film having a thickness of approximately 50 nanometers and being deposited on the polysilicon film.

A first inter-layer insulator 10 is entirely provided to cover the first floating gate electrodes 6 and the field oxide films 2. The first inter-layer insulator 10 has through holes positioned over the individual first floating gate electrodes 6. Bit lines 3 are formed on the first inter-layer insulator 10. The bit lines 3 are positioned separately from the through holes. The role of the bit lines 3 is to transmit write/read signals. The bit lines 3 may be made of high melting point metals such as W and Ti or silicides thereof. A second inter-layer insulator 11 is entirely provided to cover the bit lines 3 and the first inter-layer insulator 10. Each of the first and second inter-layer insulators 10 and 11 may comprise a silicon oxide film formed by the chemical vapor deposition and subsequent chemical mechanical polishing. Alternatively, each of the first and second inter-layer insulators 10 and 11 may comprise a boron-phosphate-silicate-glass film with a thermal flexibility. In any event, the first and second inter-layer insulators 10 and 11 have level surfaces. The second inter-layer 11 also has through holes positioned over the through holes of the first inter-layer insulator 10. The through holes of the first and second inter-layer insulators 10 and 11 may be formed by dry etching. The through holes of the first and second inter-layer insulators 10 and 11 making a pair constitute a contact hole. The titanium nitride film constituting the first floating gate electrode 6 has a resistance to the dry etching. In the contact holes, the floating gate contacts 7 are provided, which are made of phosphorus-doped polysilicon so that the floating gate contacts 7 are in contact with the first floating gate electrodes.

Second floating gate electrodes 8 are provided on the second inter-layer insulator 11 so that the second floating gate electrodes 8 are in contact with the first floating gate electrodes 6 via the floating gate contacts 7 thereby the second floating gate electrodes 8 are made pair with the first floating gate electrodes 6.

A second gate oxide film 12 is entirely provided to cover the second floating gate electrodes 8 and the second inter-layer insulator 11. The second gate oxide film 12 comprises a lamination of a silicon oxide film and a silicon nitride film.

Word lines 4 are formed on the second gate oxide films. The word lines 4 over the second floating gate electrodes 8 serve as control gate electrodes. The word lines 4 serving as the control gate electrodes comprise laminations of a phosphorus-doped polysilicon film with a thickness of 200 nanometers and a tungsten silicide film 200 nanometers. The phosphorus doped polysilicon film is formed by a chemical vapor deposition using a growth temperature in the range of 550° C. to 650° C. The tungsten silicide film is formed by sputtering at a low temperature below 650° C. A third inter-layer insulator 13 is entirely formed to cover the word lines 4 and the second gate oxide film 12.

In this embodiment, further supplemental bit lines 53 are formed on the third inter-layer insulator 13. The supplemental bit lines 53 are positioned over the bit lines 3 so that the supplemental bit lines 53 are coupled with the bit lines 3 under them via bit line contacts formed in contact holes. These contact holes are formed in the second and third inter-layer insulators 11 and 13 as illustrated in FIG. 7B. The supplemental bit lines are made of aluminum. A fourth inter-layer insulator 54 is entirely formed to cover the supplemental bit lines and the third inter-layer insulator 13.

The supplemental bit lines 53 provide a substantial reduction in the resistance of the paired bit lines 3 and 53. The reduction in the resistance of the paired bit lines 3 and 53 enables increase in the length of the bit lines for facilitating a substantial increase in the memory capacity of the memory device.

Further as described in the foregoing embodiments, the bit lines 3 are provided above the first floating gate electrodes 6 and below the second gate electrodes 8. The first floating gate 6 is provided on the first gate oxide film 9 positioned on the channel region. The first and second floating gate electrodes 6 and 8 are coupled via the floating gate contact 7. The second gate oxide film 12 is formed on the second floating gate electrode 8. The second floating gate electrode 8 has a lager area than an area of the first floating gate oxide film 6. The second gate oxide film 12 has the same size as the second floating gate electrode 8. Thus, the area of the second gate oxide film 12 on the second floating gate electrode 8 is larger than the area of the first floating gate electrode 6. Therefore, the area of the second gate oxide film 12 in contact with the second floating gate electrode 8 is larger than the area of the first gate oxide film 9 in contact with the first floating gate electrode 6. The gate structure is regarded as comprising first and second capacitors. The first capacitor comprises the channel region, the first floating gate electrode 6 and the first gate oxide film in contact with the first floating gate electrode 6. The second capacitor comprises the second floating gate electrode 8, the second gate oxide film 12 and the control gate electrode 4. The ratio of S2, the area of the second gate oxide film, to S1, the area of the first gate oxide film in contact with the first floating gate electrode 6 is approximately 4. This structure provides a large ratio of the capacity of the second capacitor to the capacity of the first capacitor, thereby resulting in increased electric field across the first gate oxide film. This can facilitate electron injection into or discharge from the first floating gate electrode 6 electrically coupled via the floating gate contact 7 to the second floating gate electrode 8. The necessary control voltage to be applied to the control electrode or the word line 4 is reduced to approximately a half of that necessary when the ratio of S2/S1 is approximately 1. The above memory cell structure allows the necessary control voltage level to be considerably reduced to a half of that needed by the conventional memory cell structure. This results in a substantial reduction of the power consumption.

The second capacitor of the memory cell is fabricated in the last process. The heat treatment is carried out at a low temperature of 650° C. For this reason, either a dielectric film with a high dielectric constant or a ferrodielectric film is available for the second gate oxide film 12 so as to increase the ratio of the capacity of the second capacitor to the capacity of the first capacitor. As the dielectric film, tantalum oxide, strontium titanium oxide, barium strontium titanate, zirconate lead titanate are for example available. In this case, the word line 4 on the second gate oxide film 12 should be made of materials which show no chemical reaction with the above chemical substances. For example, TiN, Pt, iridium oxide and ruthenium oxide are available. This structure provides a largely increased ratio of capacity of the second capacitor to the capacity of the first capacitor, thereby resulting in a largely increased electric field across the first gate oxide film. This can further facilitate electron injection into or discharge from the first floating gate electrode 6. The necessary control voltage to be applied to the control electrode or the word line 4 is reduced to approximately a quarter of that necessary for the conventional memory device. The above memory cell structure allows the necessary control voltage level to be considerably reduced to a quarter of that needed by the conventional memory cell structure. This results in a considerable reduction of the power consumption.

The second capacitor, which comprises the second floating gate electrode 8, the second gate oxide film 12 and the control gate electrode 4, are formed by the dry etching and positioned above the first gate oxide film and the silicon substrate 1. For this reason, the first gate oxide film 9 and the silicon substrate 1 are free from any damage due to the dry etching process. The surface of the second inter-layer insulator 11 are level on which the second floating gate electrode 8, the second gate oxide film 12 and the control gate electrode 4 are formed by the dry etching. This makes it easy to do complete and accurate patterning.

Applicability of the above-described invention is not limited to the above flash memory device. The present invention is applicable to other non-volatile semiconductor memory devices such as PROMs and EPROMs. In PROMs and EPROMs, the erasure is made by an irradiating ultra-violet ray to the memory cells. Particularly, in the memory cell structures described in the first, second third embodiments, the bit lines are provided under the word lines. This provides an effective irradiation of the ultra-violet ray to the memory cells. As a result, the erasure time is reduced to approximately a half of the electrical erasing time.

Whereas modifications of the present invention will be apparent to a person having ordinary skill in the art to which the invention pertains, it is to be understood that embodiments as shown and described by way of illustrations are by no means intended to be considered in a limiting sense. Accordingly, it is to be intended to cover by claims all modifications of the present invention which fall within the spirit and scope of the invention.

What is claimed is:

1. A floating gate electrode structure in a non-volatile semiconductor memory device comprising:

a base portion horizontally extending on a first gate insulation film positioned over a semiconductor substrate;

a contact portion upwardly extending from the base portion, said contact portion being provided within a vertical contact hole formed in an inter-layer insulator covering said base portion, said inter-layer insulator enclosing bit lines, said bit lines being electrically separated by said inter-layer insulator from both said contact portion and said base portion;

a head portion horizontally extending over said inter-layer insulator to be in contact with said contact portion, said head portion being electrically separated by said inter-layer insulator from said bit lines, said head portion being electrically coupled to said base portion via said contact portion;

a second gate insulation film extending over said head portion so that an area of a first interface between said base portion and said first gate insulation film is smaller than an area of a second interface between said head portion and said second gate insulation film; and a control electrode extending over said second gate insulation film, said control electrode being positioned above said head portion, wherein said bit lines are positioned entirely above said base portion and entirely below said head portion, each of said bit lines extends laterally and is overlaid by said inter-layer insulator positioned under said head portion, and said control electrode is positioned above said head portion and also above said bit lines.

2. The structure as claimed in claim 1, wherein the area of said first interface between said base portion and said first gate insulation film is at most a half of the area of the second interface between said head portion and said second gate insulation film.

3. The structure as claimed in claim 1, wherein said first gate insulation film is made of the same dielectric material as said second gate insulation film.

4. The structure as claimed in claim 1, wherein said dielectric material is silicon oxide.

5. The structure as claimed in claim 1, wherein said first gate insulation film comprises a single film made of silicon oxide and said second gate insulation film comprises at least a lamination of a silicon oxide film and a silicon nitride film.

6. The structure as claimed in claim 1, wherein said first gate insulation film is made of a first dielectric material having a first dielectric constant smaller than a second dielectric constant of a second dielectric material from which said second gate insulation film is made.

7. The structure as claimed in claim 6, wherein said first gate insulation film is made of a material selected from the group consisting of silicon oxide, silicon nitride and silicon oxynitride;

said second gate insulation film is made of a material selected from the group consisting of tantalum oxide, strontium titanate, barium strontium titanate and zirconate lead titanate; and said control electrode is made of a material selected from the group consisting of titanium nitride, platinum iridium oxide and ruthenium oxide.

8. The structure as claimed in claim 1, wherein said base portion comprises a lamination of a polysilicon film doped with an impurity and a titanium nitride film on said polysilicon film.

9. The structure as claimed in claim 1, wherein said head portion has vertical walls extending upwardly from opposite ends thereof.

10. The structure as claimed in claim 1, wherein said head portion has a recessed portion at an upper portion thereof.

11. The structure as claimed in claim 1, further comprising:

an upper inter-layer insulator provided to embed said control electrode, said second gate insulation film and said head portion; and a supplemental bit line provided on said upper inter-layer insulator, said supplemental bit line being electrically coupled via a bit line contact to said bit line, said bit line contact being provided within a bit line contact hole provided in said inter-layer insulator and said upper inter-layer insulator.

12. The structure as claimed in claim 1, wherein said supplemental bit line is made of aluminum.

13. The structure as claimed in claim 1, wherein said control electrode comprises a lamination of a polysilicon film and a tungsten silicide film on said polysilicon film.

* * * * *